United States Patent
Qian et al.

(10) Patent No.: US 8,946,900 B2
(45) Date of Patent: Feb. 3, 2015

(54) X-LINE ROUTING FOR DENSE MULTI-CHIP-PACKAGE INTERCONNECTS

(71) Applicants: Zhiguo Qian, Chandler, AZ (US); Kemal Aygun, Chandler, AZ (US)

(72) Inventors: Zhiguo Qian, Chandler, AZ (US); Kemal Aygun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 13/665,706

(22) Filed: Oct. 31, 2012

(65) Prior Publication Data

US 2014/0117552 A1    May 1, 2014

(51) Int. Cl.
*H01L 23/48* (2006.01)
*H01L 23/52* (2006.01)
*H01L 29/40* (2006.01)

(52) U.S. Cl.
USPC ............................ 257/762; 257/531; 438/462

(58) Field of Classification Search
USPC .................................. 257/531, 762; 438/462
See application file for complete search history.

(56) References Cited

U.S. PATENT DOCUMENTS

| | | | |
|---|---|---|---|
| 2011/0291167 A1* | 12/2011 | Shimooka et al. | 257/296 |
| 2012/0007211 A1* | 1/2012 | Aleksov et al. | 257/508 |
| 2013/0168854 A1* | 7/2013 | Karikalan et al. | 257/738 |

* cited by examiner

*Primary Examiner* — Phuc Dang
(74) *Attorney, Agent, or Firm* — Blakely, Sokoloff, Taylor & Zafman LLP

(57) ABSTRACT

X-line routing arrangements for dense multi-chip-package interconnects are described. In an example, an electronic signal routing structure includes a substrate. A plurality of layers of conductive traces is disposed above the substrate. A first pair of ground traces is disposed in a first of the plurality of layers of conductive traces. A signal trace is disposed in a second of the plurality of layers of conductive traces, below the first layer. A second pair of ground traces is disposed in a third of the plurality of layers of conductive traces, below the first layer. The first and second pairs of ground traces and the signal trace provide an X-pattern routing from a cross-sectional perspective.

14 Claims, 7 Drawing Sheets

X-LINE ROUTING FOR DENSE MULTI-CHIP-PACKAGE INTERCONNECTS

TECHNICAL FIELD

Embodiments of the invention are in the field of semiconductor packages and, in particular, routing arrangements for dense multi-chip-package interconnects.

BACKGROUND

Today's consumer electronics market frequently demands complex functions requiring very intricate circuitry. Scaling to smaller and smaller fundamental building blocks, e.g. transistors, has enabled the incorporation of even more intricate circuitry on a single die with each progressive generation. Semiconductor packages are used for protecting an integrated circuit (IC) chip or die, and also to provide the die with an electrical interface to external circuitry. With the increasing demand for smaller electronic devices, semiconductor packages are designed to be even more compact and must support larger circuit density. Furthermore, the demand for higher performance devices results in a need for an improved semiconductor package that enables a thin packaging profile and low overall warpage compatible with subsequent assembly processing.

C4 solder ball connections have been used for many years to provide flip chip interconnections between semiconductor devices and substrates. A flip chip or Controlled Collapse Chip Connection (C4) is a type of mounting used for semiconductor devices, such as integrated circuit (IC) chips, MEMS or components, which utilizes solder bumps instead of wire bonds. The solder bumps are deposited on the C4 pads, located on the top side of the substrate package. In order to mount the semiconductor device to the substrate, it is flipped over—the active side facing down on the mounting area. The solder bumps are used to connect the semiconductor device directly to the substrate. However, this approach may be limited by the size of the mounting area and may not readily accommodate stacked die.

On the other hand, conventional wire-bonding approaches may limit the number of semiconductor die that can reasonably be included in a single semiconductor package. Furthermore, general structural issues may arise when attempting to package a large number of semiconductor die in a semiconductor package.

Newer packaging and die-to-die interconnect approaches, such as through silicon via (TSV) and silicon interposer, are gaining much attention from designers for the realization of high performance Multi-Chip Module (MCM) and System in Package (SiP). However, additional improvements are needed in the evolution of semiconductor packages and die-to-die interconnection approaches.

DESCRIPTION OF THE EMBODIMENTS

Routing arrangements for dense multi-chip-package interconnects are described. In the following description, numerous specific details are set forth, such as packaging and interconnect architectures, in order to provide a thorough understanding of embodiments of the present invention. It will be apparent to one skilled in the art that embodiments of the present invention may be practiced without these specific details. In other instances, well-known features, such as specific semiconductor fabrication processes, are not described in detail in order to not unnecessarily obscure embodiments of the present invention. Furthermore, it is to be understood that the various embodiments shown in the Figures are illustrative representations and are not necessarily drawn to scale.

One or more embodiments of the present invention are directed to X-line routing for dense multi-chip-package interconnects. Embodiments described herein may have applications in high density interconnects, multi-chip-package, on-die interconnects, etc. In one embodiment, implementation of an X-line design effectively increases the distance between a signal line and surrounding ground traces to reduce the capacitance. Such an approach may provide a structure having voids in a ground layer directly above and underneath any signal line. As such, parallel plate capacitance may be minimized. In one embodiment, implementation of X-line routing is used to offset signals in adjacent layers to avoid crosstalk across such layers. In a specific embodiment, metal density needs for manufacturability are met by the addition of extra traces, which can be either grounded or floating.

To provide context, silicon interposer, silicon bridge, and embedded interconnect bridge (EmIB) technologies have been used to provide ultra dense interconnections between dies in a package. Use of such features has capitalized on their capability to leverage fine silicon routing design rules. Depending on the overall packaging architecture and the corresponding placement of input/output (I/O) bumps on packaged dies, the interconnect length can be 6 mm, or even longer. However, transmission lines on the silicon are highly lossy which may cause signal rising time to degrade quadratically with the routing length. As such, signaling over multi-millimeters for any of these technologies can be challenging.

Figure 1:
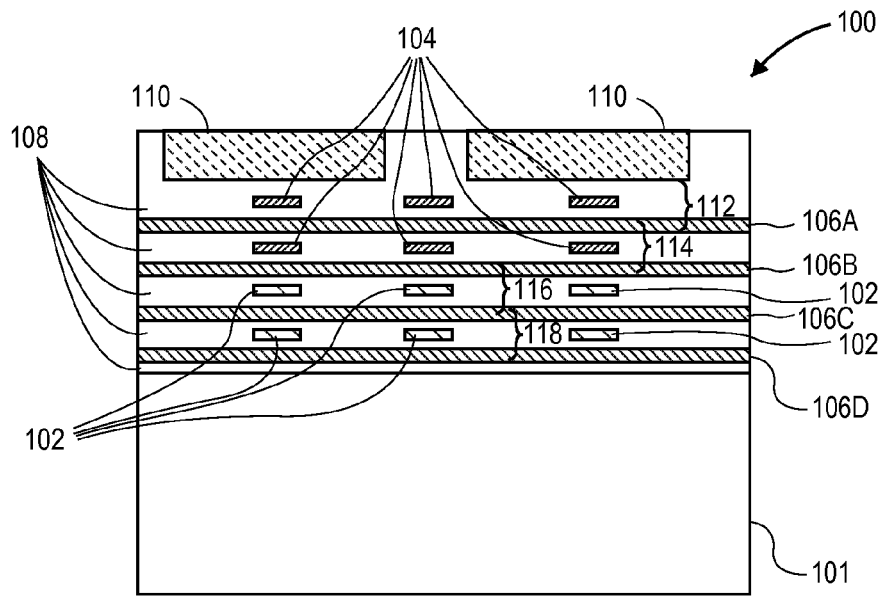
FIG. 1 illustrates a cross-sectional view of an exemplary routing structure having an embedded interconnect bridge (EmIB) routing design with 8 metal layers and including one microstrip and three stripline features.

Addressing the above issues, microstrip or stripline designs have been widely implemented as routing options, an example of which is shown in FIG. 1 and described in greater detail below. In general, in order to achieve improved signaling performance, a cross section of the signal trace tends to be larger for smaller resistance and the gap between signal and surround ground reference tends to be larger for smaller capacitance. Both requirements have led to a drive for thicker metal and via layers. However, silicon processes are typically most compatible with structures having thin metal layers as well as and thin silicon dioxide layers. Furthermore, with respect to present day silicon design rules, a stripline approach shows degraded signaling performance versus a microstrip approach, as shown in FIG. 2 and described in greater detail below.

FIG. 1 illustrates a cross-sectional view of an exemplary routing structure having an embedded interconnect bridge (EmIB) routing design with 8 metal layers and including one microstrip and three stripline features. Referring to FIG. 1, a routing structure 100 includes a plurality of signal lines 102 of a first channel and a plurality of signal lines 104 of a second channel disposed above a substrate 101, such as a silicon substrate. A plurality of ground planes 106A, 106B, 106C and 106D are disposed between the signal lines 102 and 104. Dielectric layers 108 and contact pads 110 are also included. In a specific example, the ground planes may be meshed instead of solid in the direction into the page (not shown). A microstrip 112 is formed from ground plane 106A and overlying signal lines 104. A first stripline 114 is formed from ground planes 106A and 106B and sandwiched signal lines 104. A second stripline 116 is formed from ground planes 106B and 106C and sandwiched signal lines 102. A third stripline 118 is formed from ground planes 106C and 106D and sandwiched signal lines 102.

Figure 2:
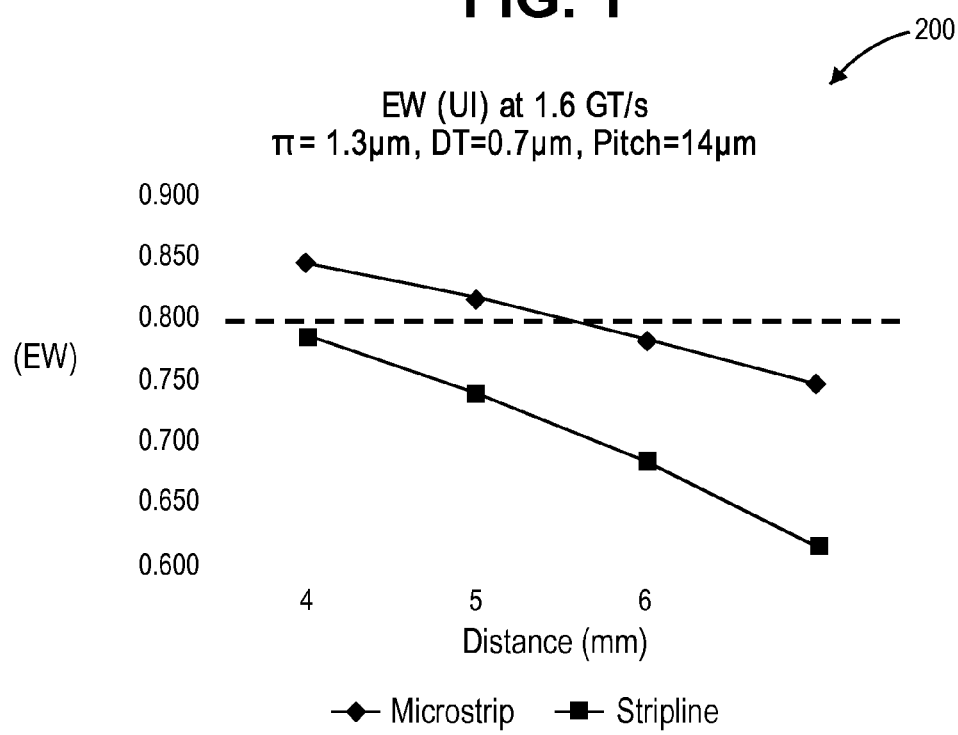
FIG. 2 is a plot providing an eye diagram comparison between a microstrip feature and a stripline feature of an EmIB routing design.

FIG. 2 is a plot 200 providing an eye diagram comparison between a microstrip feature and a stripline feature of an EmIB routing design. Referring to plot 200, eye width (EW) as a function of distance (mm) is greater the shorter the distance of the feature. For example, for a case having a target EW of 0.8 unit interval (UI), 0.13UI EW delta at 7 mm is observed, which is significant. Since stripline routing encompasses a multi-layer design, such routing can provide a signaling bottleneck. For example, stripline routing often cannot meet the target EW requirement even for 4 mm routing length in this particular example.

Figure 3B:
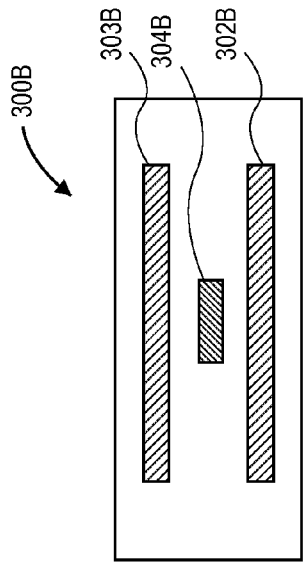
FIG. 3B is a cross-sectional view of a stripline building block.
Figure 3D:
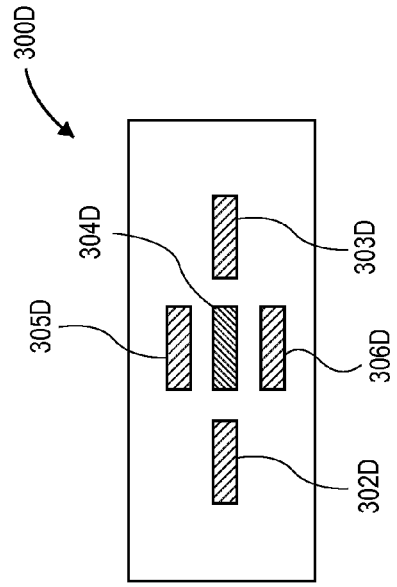
FIG. 3D is a cross-sectional view a co-axial line building block.
Figure 3A:
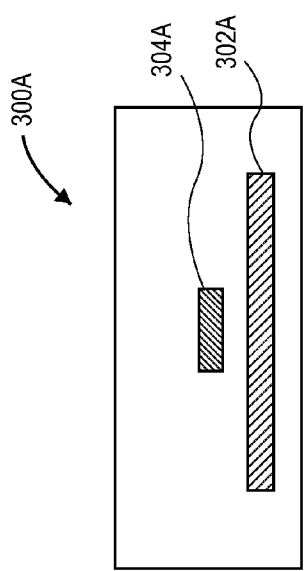
FIG. 3A is a cross-sectional view of a microstrip building block.
Figure 3C:
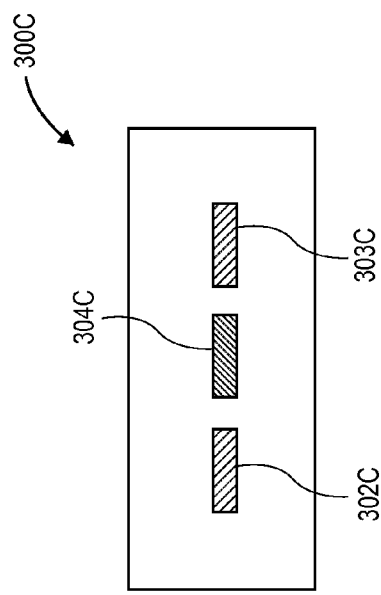
FIG. 3C is a cross-sectional view of a co-planar waveguide building block.

In order to provide a visual comparison for X-line routing of embodiments of the present invention (described in association with FIGS. 4A and 4B below), FIGS. 3A-3D are cross-sectional views of basic building blocks of various routing options. Referring to FIG. 3A, a microstrip building block 300A includes a ground plane 302A below a signal line 304A. Referring to FIG. 3B, a stripline building block 300B includes a first ground plane 302B, a second ground plane 303B, and a sandwiched signal line 304B. Referring to FIG. 3C, a co-planar waveguide building block 300C includes a signal line 304C in between, and in the same plane as, a first ground plane 302C and a second ground plane 303C. Referring to FIG. 3D, a co-axial line building block 300D includes a signal line 304D in between, and in the same plane as, a first ground plane 302D and a second ground plane 303D. Additionally, a third ground plane 305D and a fourth ground plane 306D sandwich signal line 304B in the vertical direction.

Referring again to FIGS. 3A and 3B, microstrip and stripline routing are widely used routing options. For example, trace routing for forming multi-chip package (MCP) high speed input/output (HSIO) interconnect structures is typically formed using microstrip and/or stripline trace routing. As shown, microstrip routing may utilize a layer of signal traces separated from a ground plane by a dielectric layer. Meanwhile, stripline routing may utilize a layer of signal traces sandwiched between two ground planes and separated from the ground planes by dielectric layers.

By contrast to the building blocks described in association with FIGS. 3A-3D, an X-line routing design effectively increases the distance between a signal line and corresponding surrounding ground traces. The arrangement may be used to effectively reduce the capacitance of the routing arrangement. As an example, FIG. 4A illustrates a cross-sectional view of a basic X-line routing building block, in accordance with an embodiment of the present invention.

Figure 4A:
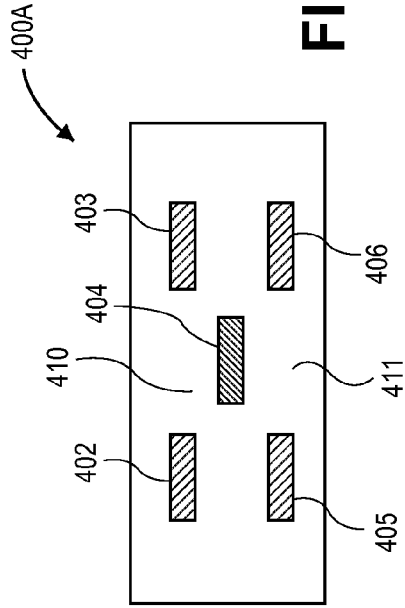
FIG. 4A illustrates a cross-sectional view of a basic X-line routing building block, in accordance with an embodiment of the present invention.

Referring to FIG. 4A, an X-line routing building block 400A includes a central signal line 404. A first ground plane 402, second ground plane 403, third ground plane 405 and fourth ground plane 406 are provided in a staggered arrangement, forming an X-shape with central signal line 404. More specifically, ground planes 402 and 403 are co-planar in a plane above the central signal line 404, and ground planes 405 and 406 are co-planar in a plane below the central signal line 404. Additionally, ground planes 402 and 405 are vertically aligned with one another, but do not overlap with or sandwich the central signal line 404. Likewise, ground planes 403 and 406 are vertically aligned with one another, but do not overlap with or sandwich the central signal line 404. The arrangement depicted in FIG. 4A thus effectively provides voids 410 and 411 in ground layers directly above and underneath signal line 404. As such, any parallel plate capacitance can be minimized. The X-line arrangement offsets signals in adjacent layers to avoid crosstalk across layers. In a specific embodiment, although not shown in FIG. 4A, requirements of metal density for manufacturability can be achieved by the addition of extra traces, which can be either grounded or floating.

Figure 4B:
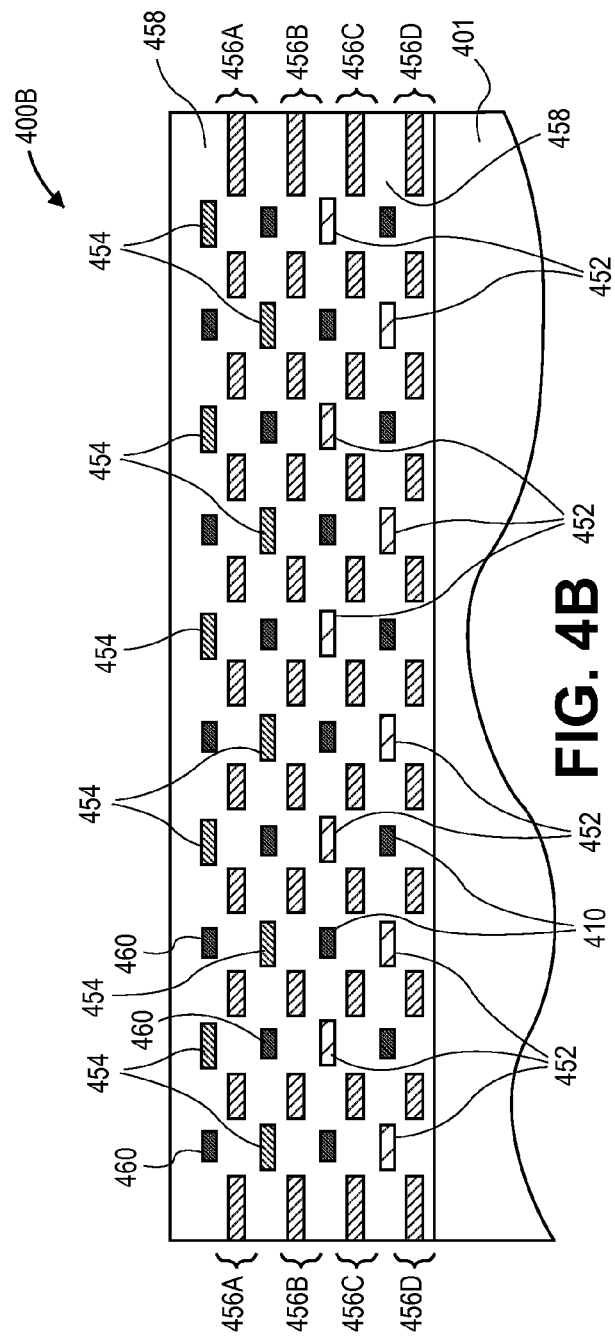
FIG. 4B illustrates a cross-sectional view of an exemplary X-line based routing structure having 8 metal layers, in accordance with an embodiment of the present invention.

FIG. 4B illustrates a cross-sectional view of an exemplary X-line based routing structure having 8 metal layers, in accordance with an embodiment of the present invention. Referring to FIG. 4B, a routing structure 400B includes a plurality of signal lines 452 of a first channel and a plurality of signal lines 454 of a second channel disposed above a substrate 401, such as a silicon substrate. A plurality of segmented ground plane regions 456A, 456B, 456C and 456D, effectively incorporating voids along each segmented plane, are disposed between the signal lines 452 and 454. Dielectric layers 458 are also included. Although not shown, contact pads may be further included above, or in a top portion of structure 400B. In a specific embodiment, additional ground or floating lines 460 may be included to increase the metal density in the signal layers, as depicted in FIG. 4B.

Structure 400B of FIG. 4B is an exemplary full design based on and X-line routing scheme. The structure may be contrasted with that of FIG. 1. For example, in one embodiment, in order to reduce the capacitance of the signal lines, ground traces (e.g., segments) are implemented instead of a meshed plane. The ground traces and signal lines of 400B are configured in an X pattern. In one embodiment, the X-line design maintains a suitable distance between the signal and the surrounding ground traces to control an associated capacitance. The structure of FIG. 4B may be better understood as modifications to the design shown in FIG. 1. First, in one embodiment, structure 400B includes a half-pitch offset between signals across adjacent layers. Second, in one embodiment, structure 400B provides voids in the ground layers above and underneath every signal trace to reduce the parallel plate capacitance. Due to the offset, signals across adjacent routing layers do not couple directly. Thus, crosstalk across layers is suppressed. Finally, in one embodiment, the design of structure 400B has additional traces 460 between signal traces to increase the metal density suitable for a level compatible with silicon processing at a particular technology node. The additional traces 460 do not affect the signaling performance whether they are removed, grounded or left floating. In one embodiment, optimization can be achieved by appropriately sizing signal trace width and ground plane void width to achieve better signaling performance. Under such optimization, a trade-off may be struck between resistance, capacitance and crosstalk within structure 400B. Overall, in an embodiment, the X-line design effectively reduces the capacitance, improves the resistance, and maintains low crosstalk for silicon routing with multiple thin layers.

The structure 400B may be included in a semiconductor package or other arrangement including one or more semiconductor die. The structure 400B may act as a routing component such as, but not limited to, a bridge, an interposer, a package substrate, or a printed circuit board. In any case, electrical pathways extend through the structure 400B. Substrate bump-out regions may also be included, depending on the final form of structure 400B. The electrical pathways may connect to added components through solder bumps to define a routing structure similar to the embodiments described below, including a main routing region of alternating signal traces and ground traces between such bump out regions. Other connections from the structure 400B may be made, for example, for power connections to a power supply. The structure 400B may optionally include a variety of other layers such as, for example, core layers, additional routing layers, and protective layers. The surface of the structure 400B may in certain embodiments be coupled to a structure such as a printed circuit board (PCB).

Referring again to FIG. 4B, as described above, structure 400B includes multiple layers of signal traces and ground traces. In one embodiment, the ground traces and signal traces are adapted to be electrically coupled to a component such as a semiconductor die structure for transmitting signals to and from the component. FIG. 4B illustrates four routing layers extending in a horizontal direction, and includes alternating signal traces and ground traces. The traces may be formed from an electrically conductive material, for example, a metal including copper. A dielectric material may be positioned between the various signal traces and ground traces. As illustrated in the view of FIG. 4B, adjacent routing layers are configured so that there are vertically alternating signal traces and ground traces.

Any suitable dielectric material may be positioned between the signal traces and the ground traces. As illustrated in FIG. 4B, the dielectric material includes dielectric material throughout most of the routing layers of 400B and dielectric layer and in the uppermost layer and, possibly, on an underlying silicon substrate. In certain embodiments, the dielectric material between the signal traces and the ground traces in the uppermost routing layer may be a material such as a photoresist material that is used as a photoresist mask, with openings at pad regions in a bump-out region (not shown in FIG. 4B). The lower routing layers as illustrated in the embodiment of FIG. 4B include dielectric material positioned between the traces and between the routing layers. Any suitable dielectric material may be used, including, for example, silicon dioxide, ceramic, glass, and polymeric materials. One specific example of a suitable polymeric dielectric material is ABF (Ajinomoto Build-up Film), available from Ajinomoto Fine-Techno Company, Inc. The dielectric structure may be varied from that illustrated in FIG. 4B, for example, certain embodiments may have an uppermost dielectric layer that is flush with an upper surface of the upper wiring layer, or may have open regions between the traces and bonding pads in the uppermost wiring layer. Still other embodiments may, for example, use the same dielectric material in all of the routing layers. The layers of dielectric and traces may be formed using any suitable process, including, but not limited to, a build-up layer lamination process. In an embodiment, substrate 401 is a silicon substrate. However, glass, organic or ceramic may be used instead or as well. In an embodiment using an EmIB architecture, a piece of silicon is embedded into an organic package, such that the materials are more like silicon dioxide instead of package material.

While four routing layers are illustrated in FIG. 4B, embodiments may include more or less rows of alternating signal and ground traces. Any suitable number of traces per layer may also be used, with different layers having a different number of traces if desired. Embodiments may also include additional layers above and/or below the routing layers. For example, an additional layer may be formed from one or more sub-layers including, but not limited to, one or more additional routing layers (including metal and dielectric), protective layers, core layers, metallization layers, and other device layers (for example, capacitor layers). The routing structure 400B may be formed as a discrete component or as a portion of another component. The routing structure 400B may be formed as part of an active component or as part or all of a passive component.

Figure 5A:
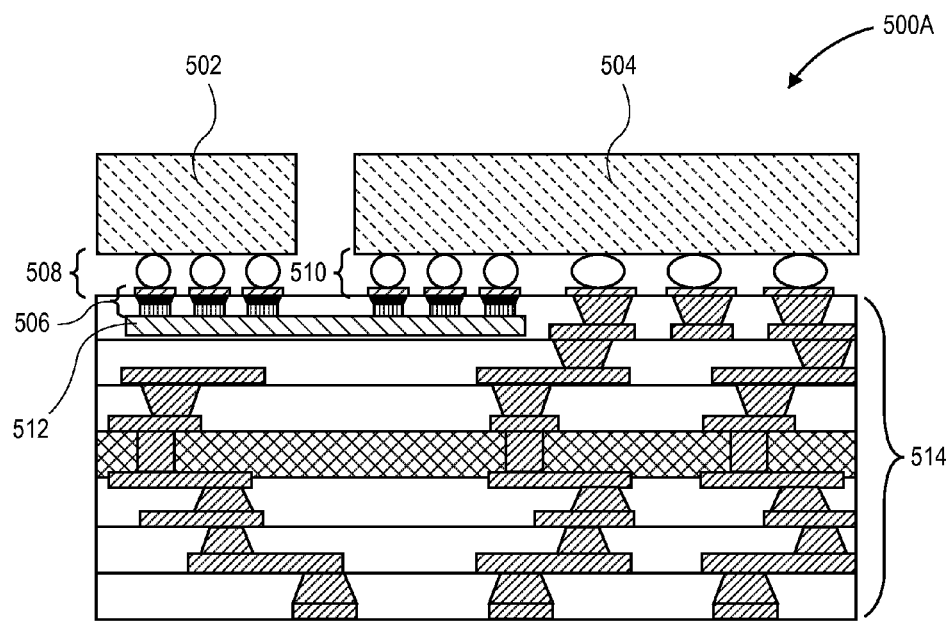
FIG. 5A illustrates a cross-sectional view of a semiconductor package including multiple die coupled with an embedded interconnect bridge (EmIB) having X-line routing therein, in accordance with an embodiment of the present invention.

In an example implementation, FIG. 5A illustrates a cross-sectional view of a semiconductor package 500A including multiple die coupled with an EmIB having X-line routing therein, in accordance with an embodiment of the present invention. Referring to FIG. 5A, the semiconductor package 500A includes a first die 502 (such as a CPU, memory chipset, etc.) and a second die 504 (such as a CPU, memory chipset, etc.). The first die 502 and second die 504 are coupled to an EmIB 506 through bumps 508 and 510 of the first die 502 and second die 504, respectively, and bond pads 512 of the silicon bridge, e.g., by thermal compression bonding (TCB). The first die 502, second die 504, and EmIB 506 are included with additional routing layers 514, as depicted in FIG. 5A. The additional routing layers may be simple or complex and may be for coupling to other packages or may form part or all of an organic package or printed circuit board (PCB), etc. In one embodiment, the routing of EmIB 506 has an X-line routing such as described in association with FIG. 4A, as particular embodiment of which is described in association with FIG. 4B. In another embodiment, a silicon bridge is used and is not embedded in the package, but rather in an open cavity.

Figure 5B:
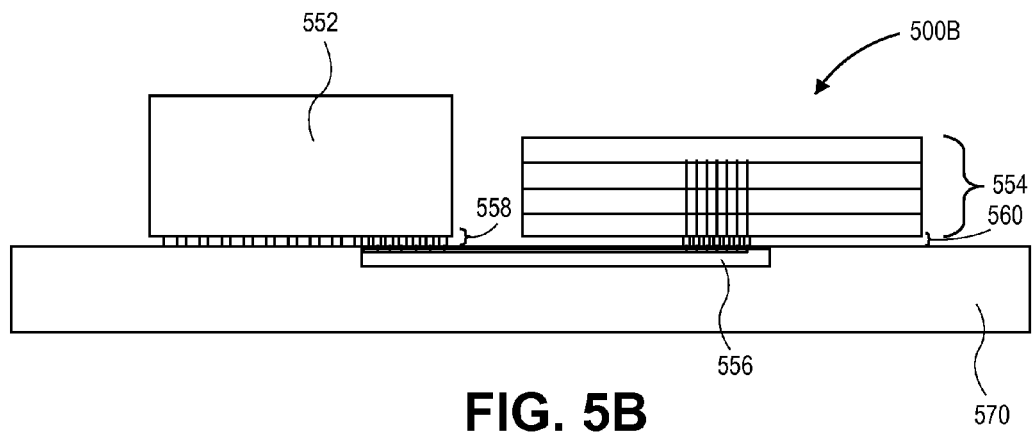
FIG. 5B illustrates a cross-sectional view of a semiconductor package including multiple die coupled with an embedded interconnect bridge (EmIB) having X-line routing therein, in accordance with an embodiment of the present invention.

In another example implementation, FIG. 5B illustrates a cross-sectional view of a semiconductor package 500B including multiple die coupled with an embedded interconnect bridge (EmIB) having X-line routing therein, in accordance with an embodiment of the present invention. Referring to FIG. 5B, the semiconductor package 500B includes a first die 552 (such as a central processing unit, CPU) and a second die 554 (such as an additional CPU or a memory die or memory die stack, the memory die stack depicted in FIG. 5B). The first die 552 and second die 554 are coupled to an EmIB 556 through bumps 558 and 560 of the first die 552 and second die 554, respectively, e.g., by thermal compression bonding (TCB). The EmIB 556 is embedded in substrate (e.g., flexible organic substrate) or board (such as epoxy PCB material) material 570, as depicted in FIG. 5B. In one embodiment, the routing of EmIB 556 has an X-line routing such as described in association with FIG. 4A, as particular embodiment of which is described in association with FIG. 4B.

Figure 6:
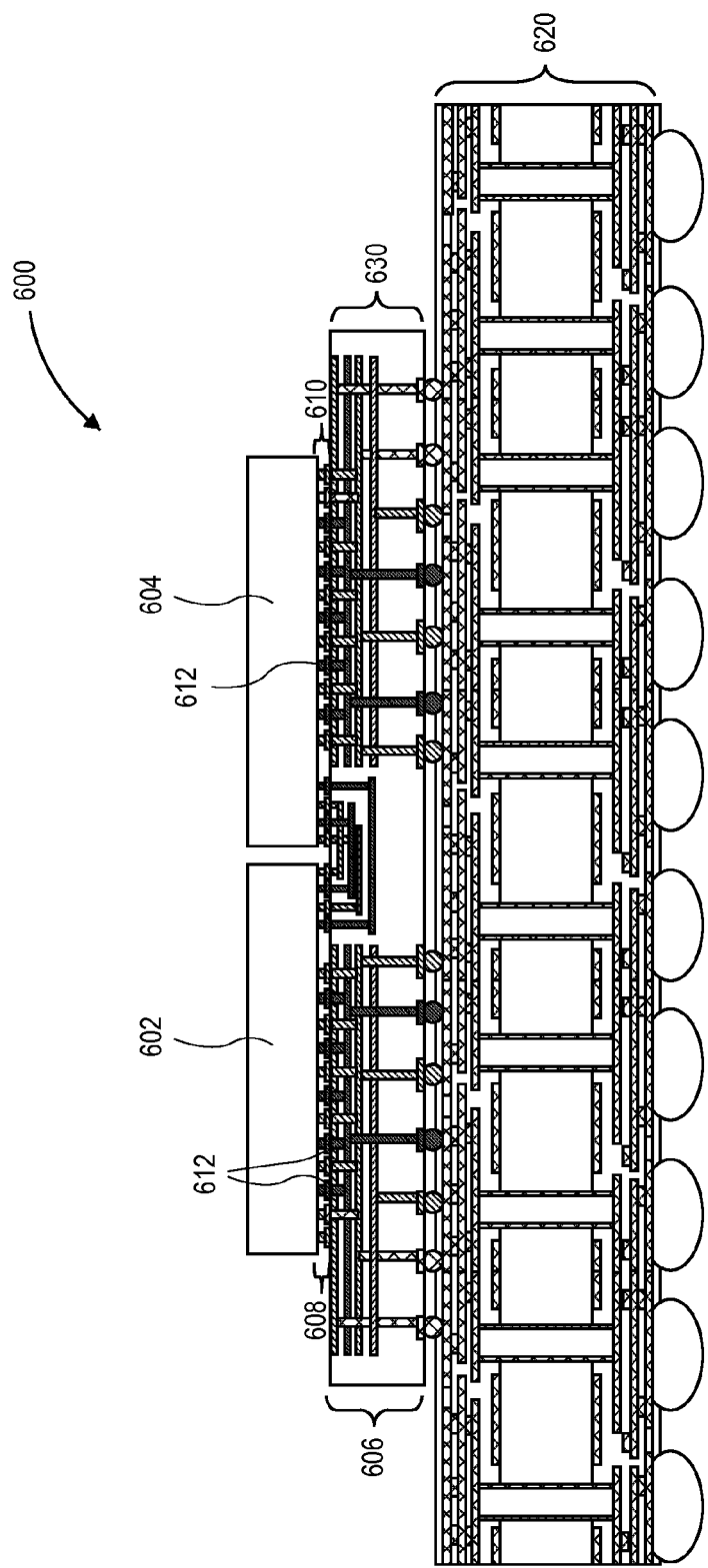
FIG. 6 illustrates a cross-sectional view of a semiconductor package including multiple die coupled with an interposer having X-line routing therein, in accordance with an embodiment of the present invention.

In an exemplary implementation, FIG. 6 illustrates a cross-sectional view of a semiconductor package 600 including multiple die coupled with an interposer having X-line routing therein, in accordance with an embodiment of the present invention. Referring to FIG. 6, the semiconductor package 600 includes a first die 602 and a second die 604. The first die 602 and second die 604 are coupled to an interposer 606, such as a silicon interposer. The first die 602 and second die 604 are coupled to the interposer 606 through bumps 608 and 610 of the first die 602 and second die 604, respectively, and bond pads 612 of the interposer 606, e.g., by thermal compression bonding (TCB). The interposer 606 couples the first die 602 and second die 604 with an organic package 620. The organic package 620 may include its own routing layers, as depicted in FIG. 6. Coupling through interposer 606 may be achieved by use of through silicon vias (TSVs) 630, as is also depicted in FIG. 6. In one embodiment, the routing of interposer 606 has an X-line routing such as described in association with FIG. 4A, a particular embodiment of which is described in association with FIG. 4B.

Figure 7:
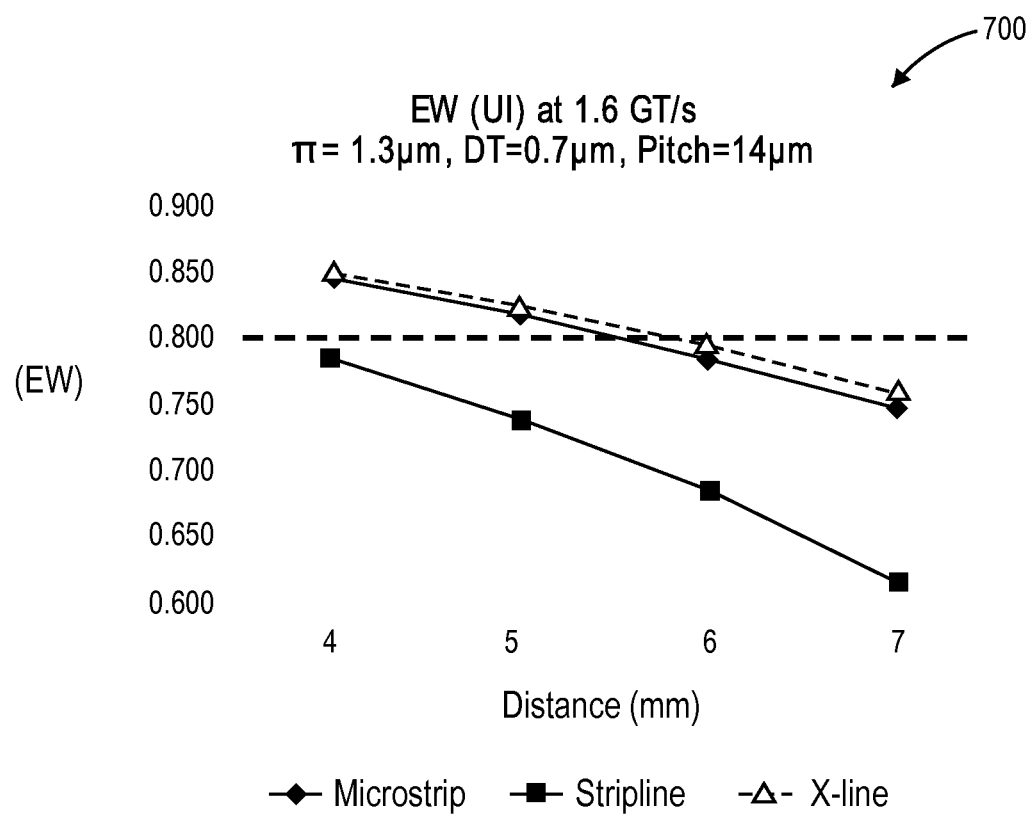
FIG. 7 is a plot providing an eye diagram comparison between a microstrip feature, a stripline feature, and an X-line feature routing design for present day design rules, in accordance with an embodiment of the present invention.

The examples shown in FIGS. 5A, 5B and 6 may provide designs for achieving high bandwidth dense interconnects between dies. The X-line designs used therein (e.g., in the form of a silicon bridge, an interposer, or an embedded interconnect bridge) may provide a signaling advantage over previous routing approaches. For example, FIG. 7 is a plot 700 providing an eye diagram comparison between a microstrip feature, a stripline feature, and an X-line feature routing design for present day design rules, in accordance with an embodiment of the present invention. Referring to plot 700, EW is shown as a function of distance (mm) for a metal layer set at 1.3 μm thickness, a via layer set at 0.7 μm thickness, and a routing pitch set at 14 μm. The eye width at 1.6 GT/s shows that X-line routing is significantly improved over stripline and microstrip routing at the same routing density. As such, in an embodiment, an X-line design can be implemented to remove the bottleneck associated with stripline routing. Furthermore, the X-line routing design may be used for providing electrical improvements in multi-layer silicon interconnect designs.

Thus, one or more embodiments described herein relate to substrate routing structures in which reduced crosstalk is achieved while utilizing a minimum number of layers, without any increase in the surface area of the substrate or die. Certain embodiments include segmenting ground traces within a same horizontal layer. Embodiments may also include alternating signal and ground traces in the vertical direction. Implementations include applications in multi-chip packages, organic package substrates, transmission lines, 2.5 D (Si feature between die and board), on-die, on package, etc. architectures. Such implementations may enable increased density for IOs to provide increased signals at low speed, which may be more efficient than fewer signals at high speed.

Figure 8:
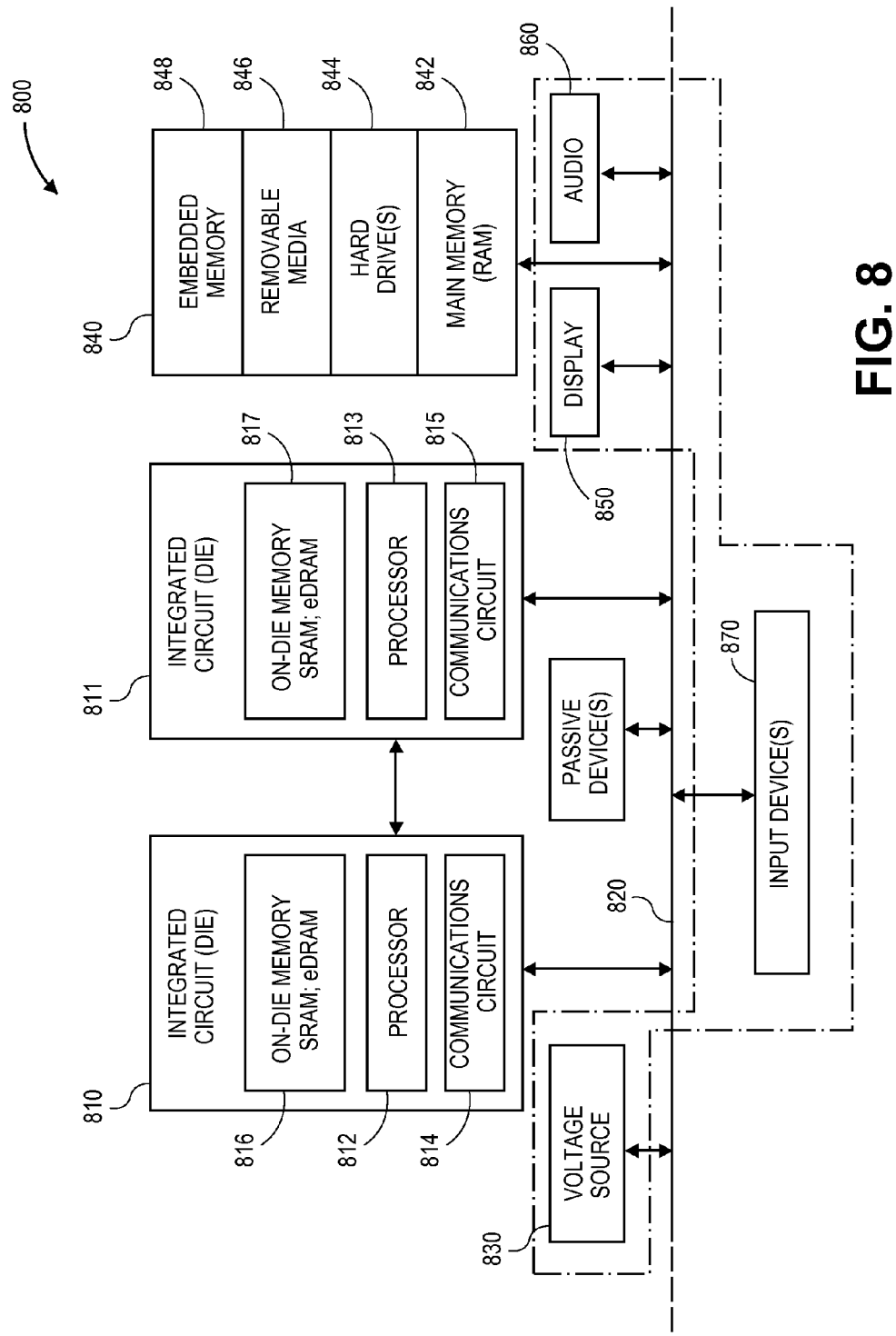
FIG. 8 is a schematic of a computer system, in accordance with an embodiment of the present invention.

FIG. 8 is a schematic of a computer system 800, in accordance with an embodiment of the present invention. The computer system 800 (also referred to as the electronic system 800) as depicted can embody an X-line routing arrangement for dense multi-chip-package interconnects according to any of the several disclosed embodiments and their equivalents as set forth in this disclosure. The computer system 800 may be a mobile device such as a netbook computer. The computer system 800 may be a mobile device such as a wireless smart phone. The computer system 800 may be a desktop computer. The computer system 800 may be a hand-held reader. The computer system 800 may be a server system. The computer system 800 may be a supercomputer or high-performance computing system.

In an embodiment, the electronic system 800 is a computer system that includes a system bus 820 to electrically couple the various components of the electronic system 800. The system bus 820 is a single bus or any combination of busses according to various embodiments. The electronic system 800 includes a voltage source 830 that provides power to the integrated circuit 810. In some embodiments, the voltage source 830 supplies current to the integrated circuit 810 through the system bus 820.

The integrated circuit 810 is electrically coupled to the system bus 820 and includes any circuit, or combination of circuits according to an embodiment. In an embodiment, the integrated circuit 810 includes a processor 812 that can be of any type. As used herein, the processor 812 may mean any type of circuit such as, but not limited to, a microprocessor, a microcontroller, a graphics processor, a digital signal processor, or another processor. In an embodiment, the processor 812 includes, or is coupled with, an X-line routing arrangement for dense multi-chip-package interconnects, as disclosed herein. In an embodiment, SRAM embodiments are found in memory caches of the processor. Other types of circuits that can be included in the integrated circuit 810 are a custom circuit or an application-specific integrated circuit (ASIC), such as a communications circuit 814 for use in wireless devices such as cellular telephones, smart phones, pagers, portable computers, two-way radios, and similar electronic systems, or a communications circuit for servers. In an embodiment, the integrated circuit 810 includes on-die memory 816 such as static random-access memory (SRAM). In an embodiment, the integrated circuit 810 includes embedded on-die memory 816 such as embedded dynamic random-access memory (eDRAM).

In an embodiment, the integrated circuit 810 is complemented with a subsequent integrated circuit 811. Useful embodiments include a dual processor 813 and a dual communications circuit 815 and dual on-die memory 817 such as SRAM. In an embodiment, the dual integrated circuit 810 includes embedded on-die memory 817 such as eDRAM.

In an embodiment, the electronic system 800 also includes an external memory 840 that in turn may include one or more memory elements suitable to the particular application, such as a main memory 842 in the form of RAM, one or more hard drives 844, and/or one or more drives that handle removable media 846, such as diskettes, compact disks (CDs), digital variable disks (DVDs), flash memory drives, and other removable media known in the art. The external memory 840 may also be embedded memory 848 such as the first die in a die stack, according to an embodiment.

In an embodiment, the electronic system 800 also includes a display device 850, an audio output 860. In an embodiment, the electronic system 800 includes an input device such as a controller 870 that may be a keyboard, mouse, trackball, game controller, microphone, voice-recognition device, or any other input device that inputs information into the electronic system 800. In an embodiment, an input device 870 is a camera. In an embodiment, an input device 870 is a digital sound recorder. In an embodiment, an input device 870 is a camera and a digital sound recorder.

As shown herein, the integrated circuit 810 can be implemented in a number of different embodiments, including an X-line routing arrangement for dense multi-chip-package interconnects according to any of the several disclosed embodiments and their equivalents, an electronic system, a computer system, one or more methods of fabricating an integrated circuit, and one or more methods of fabricating an electronic assembly that includes an X-line routing arrangement for dense multi-chip-package interconnects according to any of the several disclosed embodiments as set forth herein in the various embodiments and their art-recognized equivalents. The elements, materials, geometries, dimensions, and sequence of operations can all be varied to suit particular I/O coupling requirements including array contact count, array contact configuration for a microelectronic die embedded in a processor mounting substrate according to any of the several disclosed X-line routing arrangement for dense multi-chip-package interconnects embodiments and their equivalents. A foundation substrate may be included, as represented by the dashed line of FIG. 8. Passive devices may also be included, as is also depicted in FIG. 8.

Embodiments of the present invention include X-line routing arrangements for dense multi-chip-package interconnects.

In an embodiment, an electronic signal routing structure includes a substrate. A plurality of layers of conductive traces is disposed above the substrate. A first pair of ground traces is disposed in a first of the plurality of layers of conductive traces. A signal trace is disposed in a second of the plurality of layers of conductive traces, below the first layer. A second pair of ground traces is disposed in a third of the plurality of layers of conductive traces, below the first layer. The first and second pairs of ground traces and the signal trace provide an X-pattern routing from a cross-sectional perspective.

In one embodiment, the first pair of ground traces is a first pair of co-planar ground traces, and the second pair of ground traces is a second pair of co-planar ground traces.

In one embodiment, the first pair of co-planar ground traces is vertically aligned with the second pair of co-planar ground traces.

In one embodiment, from a vertical perspective, the traces of the first and second pairs of co-planar ground traces do not overlap with the signal trace.

In one embodiment, the plurality of layers of conductive traces is disposed in one or more dielectric layers disposed above the substrate.

In one embodiment, the substrate is a bulk crystalline silicon substrate, and the plurality of layers of conductive traces is composed of copper traces.

In one embodiment, the electronic signal routing structure further includes additional signal traces and ground traces providing additional X-pattern routing.

In one embodiment, a half-pitch offset is provided horizontally between signal traces across adjacent layers of conductive traces having signal traces therein.

In an embodiment, a semiconductor package includes first and second adjacent semiconductor dies. A silicon bridge structure electrically couples the first and second semiconductor dies, and includes a plurality of layers of conductive traces disposed above a substrate, a first pair of ground traces disposed in a first of the plurality of layers of conductive traces, a signal trace disposed in a second of the plurality of layers of conductive traces, below the first layer, and a second pair of ground traces disposed in a third of the plurality of layers of conductive traces, below the first layer. The first and second pairs of ground traces and the signal trace provide an X-pattern routing from a cross-sectional perspective. A plurality of package routing layers is also included. The silicon bridge structure is disposed in one of the package routing layers, the first and second die are disposed on the plurality of package routing layers, and at least one of the first and second die is electrically coupled to the plurality of package routing layers.

In one embodiment, the first pair of ground traces is a first pair of co-planar ground traces, and the second pair of ground traces is a second pair of co-planar ground traces.

In one embodiment, the first pair of co-planar ground traces is vertically aligned with the second pair of co-planar ground traces.

In one embodiment, from a vertical perspective, the traces of the first and second pairs of co-planar ground traces do not overlap with the signal trace.

In one embodiment, the plurality of layers of conductive traces is disposed in one or more dielectric layers disposed above the substrate of the silicon bridge structure.

In one embodiment, the substrate of the silicon bridge structure is a bulk crystalline silicon substrate, and the plurality of layers of conductive traces is composed of copper traces.

In one embodiment, the silicon bridge structure further includes additional signal traces and ground traces providing additional X-pattern routing, and a half-pitch offset is provided horizontally between signal traces across adjacent layers of conductive traces having signal traces therein.

In an embodiment, a semiconductor package includes first and second adjacent semiconductor dies. An embedded interconnect bridge (EmIB) structure electrically couples the first and second semiconductor dies, and includes a plurality of layers of conductive traces disposed above a substrate, a first pair of ground traces disposed in a first of the plurality of layers of conductive traces, a signal trace disposed in a second of the plurality of layers of conductive traces, below the first layer, and a second pair of ground traces disposed in a third of the plurality of layers of conductive traces, below the first layer. The first and second pairs of ground traces and the signal trace provide an X-pattern routing from a cross-sectional perspective. A flexible organic substrate or epoxy board is also included. The EmIB structure is disposed in the flexible organic substrate or epoxy board, and the first and second semiconductor dies are disposed on the flexible organic substrate or epoxy board.

In one embodiment, the first pair of ground traces is a first pair of co-planar ground traces, and the second pair of ground traces is a second pair of co-planar ground traces.

In one embodiment, the first pair of co-planar ground traces is vertically aligned with the second pair of co-planar ground traces.

In one embodiment, from a vertical perspective, the traces of the first and second pairs of co-planar ground traces do not overlap with the signal trace.

In one embodiment, the plurality of layers of conductive traces is disposed in one or more dielectric layers disposed above the substrate of the EmIB structure.

In one embodiment, the substrate of the EmIB structure is a bulk crystalline silicon substrate, and the plurality of layers of conductive traces is composed of copper traces.

In one embodiment, the EmIB structure further includes additional signal traces and ground traces providing additional X-pattern routing, and a half-pitch offset is provided horizontally between signal traces across adjacent layers of conductive traces having signal traces therein.

In one embodiment, a semiconductor package includes first and second adjacent semiconductor dies. A silicon interposer structure is disposed below and electrically couples the first and second semiconductor dies. The silicon interposer structure includes a plurality of layers of conductive traces disposed above a substrate, a first pair of ground traces disposed in a first of the plurality of layers of conductive traces, a signal trace disposed in a second of the plurality of conductive traces, below the first layer, and a second pair of ground traces disposed in a third of the plurality of layers of conductive traces, below the first layer. The first and second pairs of ground traces and the signal trace provide an X-pattern routing from a cross-sectional perspective. An organic package substrate is also included and is disposed below and is electrically coupled to the silicon interposer structure. The organic package substrate includes a plurality of routing layers therein.

In one embodiment, the first pair of ground traces is a first pair of co-planar ground traces, and the second pair of ground traces is a second pair of co-planar ground traces.

In one embodiment, the first pair of co-planar ground traces is vertically aligned with the second pair of co-planar ground traces.

In one embodiment, from a vertical perspective, the traces of the first and second pairs of co-planar ground traces do not overlap with the signal trace.

In one embodiment, the plurality of layers of conductive traces is disposed in one or more dielectric layers disposed above the substrate of the silicon interposer structure.

In one embodiment, the substrate of the silicon interposer structure is a bulk crystalline silicon substrate, and the plurality of layers of conductive traces is composed of copper traces.

In one embodiment, the silicon interposer structure further includes additional signal traces and ground traces providing additional X-pattern routing, and a half-pitch offset is provided horizontally between signal traces across adjacent layers of conductive traces having signal traces therein.

In one embodiment, the organic package substrate is electrically coupled to the silicon interposer structure by one or more through-silicon-vias (TSVs) disposed in the silicon interposer structure.

What is claimed is:

1. A semiconductor package, comprising:
   first and second adjacent semiconductor dies;
   a silicon bridge structure electrically coupling the first and second semiconductor dies, and comprising a plurality of layers of conductive traces disposed above a substrate of the silicon bridge structure, a first pair of ground traces disposed in a first of the plurality of layers of conductive traces, a signal trace disposed in a second of the plurality of layers of conductive traces, below the first layer, and a second pair of ground traces disposed in a third of the plurality of layers of conductive traces, below the first layer and the second layer, wherein the first and second pairs of ground traces and the signal trace provide an X-pattern routing from a cross-sectional perspective; and
   a plurality of package routing layers, wherein the silicon bridge structure is disposed in one of the package routing layers, the first and second die are disposed on the plurality of package routing layers, and at least one of the first and second die is electrically coupled to the plurality of package routing layers.

2. The semiconductor package of claim 1, wherein the first pair of ground traces is a first pair of co-planar ground traces, and the second pair of ground traces is a second pair of co-planar ground traces.

3. The semiconductor package of claim 2, wherein the first pair of co-planar ground traces is vertically aligned with the second pair of co-planar ground traces.

4. The semiconductor package of claim 3, wherein, from a vertical perspective, the traces of the first and second pairs of co-planar ground traces do not overlap with the signal trace.

5. The semiconductor package of claim 1, wherein the plurality of layers of conductive traces is disposed in one or more dielectric layers disposed above the substrate of the silicon bridge structure.

6. The semiconductor package of claim 1, wherein the substrate of the silicon bridge structure is a bulk crystalline silicon substrate, and the plurality of layers of conductive traces comprises copper traces.

7. The semiconductor package of claim 1, the silicon bridge structure further comprising:
   additional signal traces and ground traces providing additional X-pattern routing, wherein a half-pitch offset is provided horizontally between signal traces across adjacent layers of conductive traces having signal traces therein.

8. A semiconductor package, comprising:
   first and second adjacent semiconductor dies;
   an embedded interconnect bridge (EmIB) structure electrically coupling the first and second semiconductor dies, and comprising a plurality of layers of conductive traces disposed above a substrate of the EmIB structure, a first pair of ground traces disposed in a first of the plurality of layers of conductive traces, a signal trace disposed in a second of the plurality of layers of conductive traces, below the first layer, and a second pair of ground traces disposed in a third of the plurality of layers of conductive traces, below the first layer and the second layer, wherein the first and second pairs of ground traces and the signal trace provide an X-pattern routing from a cross-sectional perspective; and
   a flexible organic substrate or epoxy board, wherein the EmIB structure is disposed in the flexible organic substrate or epoxy board, and the first and second semiconductor dies are disposed on the flexible organic substrate or epoxy board.

9. The semiconductor package of claim 8, wherein the first pair of ground traces is a first pair of co-planar ground traces, and the second pair of ground traces is a second pair of co-planar ground traces.

10. The semiconductor package of claim 9, wherein the first pair of co-planar ground traces is vertically aligned with the second pair of co-planar ground traces.

11. The semiconductor package of claim 10, wherein, from a vertical perspective, the traces of the first and second pairs of co-planar ground traces do not overlap with the signal trace.

12. The semiconductor package of claim 8, wherein the plurality of layers of conductive traces is disposed in one or more dielectric layers disposed above the substrate of the EmIB structure.

13. The semiconductor package of claim 8, wherein the substrate of the EmIB structure is a bulk crystalline silicon substrate, and the plurality of layers of conductive traces comprises copper traces.

14. The semiconductor package of claim 8, the EmIB structure further comprising:
   additional signal traces and ground traces providing additional X-pattern routing, wherein a half-pitch offset is provided horizontally between signal traces across adjacent layers of conductive traces having signal traces therein.

* * * * *